(12) United States Patent
Rana et al.

(10) Patent No.: US 11,817,479 B2
(45) Date of Patent: Nov. 14, 2023

(54) TRANSISTOR WITH AIR GAP UNDER RAISED SOURCE/DRAIN REGION IN BULK SEMICONDUCTOR SUBSTRATE

(71) Applicant: GlobalFoundries U.S. Inc., Malta, NY (US)

(72) Inventors: Uzma B. Rana, Slingerlands, NY (US); Steven M. Shank, Jericho, VT (US); Anthony K. Stamper, Burlington, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 112 days.

(21) Appl. No.: 17/449,336

(22) Filed: Sep. 29, 2021

(65) Prior Publication Data
US 2023/0096544 A1    Mar. 30, 2023

(51) Int. Cl.
*H01L 29/06* (2006.01)
*H01L 21/762* (2006.01)
*H01L 21/763* (2006.01)
*H01L 29/08* (2006.01)
(Continued)

(52) U.S. Cl.
CPC ........ *H01L 29/0653* (2013.01); *H01L 21/763* (2013.01); *H01L 21/76224* (2013.01); *H01L 29/0847* (2013.01)

(58) Field of Classification Search
CPC ............ H01L 29/1054; H01L 29/7848; H01L 29/0843–0891; H01L 29/41725; H01L 29/41775; H01L 29/41783; H01L 29/66636–66643; H01L 21/823814; H01L 21/823418–823425; H01L 29/0642; H01L 29/0649–0653; H01L 21/762; H01L 21/76224–76237; H01L 21/823481; (Continued)

(56) References Cited

U.S. PATENT DOCUMENTS

| | | |
|---|---|---|
| 6,228,729 B1 | 5/2001 | Ni |
| 6,627,507 B2 | 9/2003 | Yuan |
| 6,683,367 B1 | 1/2004 | Stalmans et al. |

(Continued)

OTHER PUBLICATIONS

Chiappini et al., "Tailored porous silicon microparticles: fabrication and properties," Chemphyschem. 11(5):1029-35, Apr. 6, 2010.
(Continued)

*Primary Examiner* — Sonya McCall-Shepard
(74) *Attorney, Agent, or Firm* — Francois Pagette; Hoffman Warnick LLC

(57) ABSTRACT

A transistor includes a bulk semiconductor substrate, and first and second raised source/drain regions above the bulk semiconductor substrate. A gate is between the first and second raised source/drain regions. A first dielectric section is beneath the first raised source/drain region in the bulk semiconductor substrate, and a second dielectric section is beneath the second raised source/drain region in the bulk semiconductor substrate. A first air gap is defined in at least the first dielectric section under the first raised source/drain region, and a second air gap is defined in at least the second dielectric section under the second raised source/drain region. The air gaps reduce off capacitance of the bulk semiconductor structure to near semiconductor-on-insulator levels without the disadvantages of an air gap under the channel region.

20 Claims, 4 Drawing Sheets

(51) Int. Cl.
*H01L 21/764* (2006.01)
*H01L 29/78* (2006.01)

(58) Field of Classification Search
CPC .......... H01L 21/823878; H01L 21/763; H01L 29/0847; H01L 29/78; H01L 21/764
See application file for complete search history.

(56) References Cited

U.S. PATENT DOCUMENTS

| | | | |
|---|---|---|---|
| 7,015,147 B2 | 3/2006 | Lee et al. | |
| 7,745,296 B2 | 6/2010 | van Meer et al. | |
| 9,299,719 B2 | 3/2016 | Cheng et al. | |
| 9,685,456 B2 | 6/2017 | Zhang | |
| 9,806,170 B1 | 10/2017 | Mulfinger et al. | |
| 10,008,586 B2 | 6/2018 | Leobandung | |
| 10,170,475 B2 | 1/2019 | Allegret-Maret et al. | |
| 10,460,980 B2* | 10/2019 | Verma | H01L 21/76205 |
| 10,755,987 B2 | 8/2020 | Mason et al. | |
| 10,790,170 B2 | 9/2020 | Reber et al. | |
| 10,796,942 B2 | 10/2020 | Mariani et al. | |
| 2004/0217434 A1* | 11/2004 | Lee | H01L 29/66795 257/E21.426 |
| 2016/0093523 A1* | 3/2016 | Jaffe | H01L 21/76283 438/422 |
| 2019/0295881 A1 | 9/2019 | Shank et al. | |

OTHER PUBLICATIONS

Gharbi et al., "Shallow trench isolation based on selective formation of oxidized porous silicon," Microelectronic Engineering, 88:1214-16, 2011.
Jurczak et al., "Silicon-on-Nothing (SON)—an Innovative Process for Advanced CMOS," IEEE Transactions on Electron Devices, vol. 47, No. 11, 2179-87, Nov. 2000.
Kale and Solanki, "Synthesis of Si Nanoparticles from Freestanding Porous Silicon (PS) Film Using Ultrasonication," 978-1-4244-5892-9/10, IEEE, 2010, 6 pages.
Marsh, "Porous silicon a useful imperfection," Materials Today, vol. 5, Issue 1, pp. 36-41, Jan. 1, 2002.
Nassiopoulou et al., "Porous Si as a substrate material for RF passive integration," 978-1-4673-4802-7/13, IEEE, 2013, 5 pages.
Rack et al., "Small- and Large-Signal Performance up to 175C of Low-Cost Porous Silicon Substrate for RF Applications," IEEE Transactions on Electron Devices, vol. 65, No. 5, pp. 1887-1895, May 2018.
Notice of Allowance and Fee(s) Due dated Mar. 8, 2023 for U.S. Appl. No. 17/450,186, filed Oct. 7, 2021; pp. 8.

* cited by examiner

TRANSISTOR WITH AIR GAP UNDER RAISED SOURCE/DRAIN REGION IN BULK SEMICONDUCTOR SUBSTRATE

BACKGROUND

The present disclosure relates to integrated circuits (ICs), and more specifically, to a transistor including an air gap under raised source/drain regions in a bulk semiconductor substrate to reduce junction capacitance.

Advanced manufacturing of ICs requires formation of individual circuit elements, e.g., transistors such as field-effect-transistors (FETs) and the like, based on specific circuit designs. A FET generally includes source, drain, and gate regions. The gate region is placed between the source and drain regions, which may include raised source/drain regions, and controls the current through a channel region between the raised source and drain regions. Gates may be composed of various metals and often include a work function metal, which is chosen to create desired characteristics of the FET. Transistors may be formed over a substrate and may be electrically isolated with an insulating dielectric section, e.g., inter-level dielectric (ILD) layer or highly resistive polycrystalline layer. Contacts may be formed to each of the raised source, raised drain, and gate regions in order to electrically connect the transistor to other circuit elements that may be formed subsequent to the transistor in other metal levels.

The substrates used to form ICs generally fall into two categories: bulk semiconductor and semiconductor-on-insulator (SOI) substrates. SOI substrates include a layered semiconductor-insulator-semiconductor substrate in place of a more conventional bulk semiconductor substrate. More particularly, SOI substrates include a thin semiconductor-on-insulator (SOI) layer over a buried insulator layer over a base semiconductor layer. SOI substrates are more expensive to fabricate than bulk semiconductor substrates, but generally provide better performing ICs. For example, bulk semiconductor substrates have a higher n-type field effect transistor (NFET) off capacitance ($C_{off}$) due to their required relatively large raised source/drain junction area. The $C_{off}$ of bulk semiconductor technologies can be approximately 30% higher than that of SOI substrates due to the raised source/drain junction capacitance. One approach to improve bulk semiconductor substrate performance includes positioning an air gap under a channel region of the transistor. However, this approach increases the variability of the voltage at which the transistor turns on, i.e., its threshold voltage, and creates a mechanical stress on the channel region, making this approach difficult to use.

SUMMARY

An aspect of the disclosure is directed to a transistor, comprising: a bulk semiconductor substrate; a first raised source/drain region above the bulk semiconductor substrate separated from a second raised source/drain region above the bulk semiconductor substrate; a gate between the first raised source/drain region and the second raised source/drain region; a first dielectric section beneath the first raised source/drain region in the bulk semiconductor substrate; and a second dielectric section beneath the second raised source/drain region in the bulk semiconductor substrate; a first air gap defined in at least the first dielectric section and under the first raised source/drain region; and a second air gap defined in at least the second dielectric section and under the second raised source/drain region.

Another aspect of the disclosure includes a transistor, comprising: a bulk semiconductor substrate; a pair of raised source/drain regions above the bulk semiconductor substrate; a gate between the pair of raised source/drain regions; a dielectric section in the bulk semiconductor substrate under each of the pair of raised source/drain regions; an air gap defined in at least each dielectric section under the pair of raised source/drain regions; a polysilicon section between each of the pair of raised source/drain regions and a respective air gap; a trench isolation in the bulk semiconductor substrate and surrounding the pair of raised source/drain regions; and a doped polysilicon isolation region in the bulk semiconductor substrate and below the trench isolation, wherein the dielectric sections include a same material as the trench isolation.

An aspect of the disclosure related to a method, comprising: forming a trench isolation in a bulk semiconductor substrate, and a first dielectric section spaced from a second dielectric section in the bulk semiconductor substrate, the first and second dielectric sections each spaced from the trench isolation; forming a first polysilicon section on the first dielectric section, a second polysilicon section on the second dielectric section, and a silicon layer over the bulk semiconductor substrate between the first polysilicon section and the second polysilicon section; forming a first silicon section over the first polysilicon section and a second silicon section over the second polysilicon section; forming a gate over a region of the silicon layer between the first silicon section and the second silicon section, wherein an upper surface of the first and second silicon sections are higher than a lower surface of the gate; and forming a first air gap in the first dielectric section under the first polysilicon section and a second air gap in the second dielectric section under the second polysilicon section; and forming a first raised source/drain region in the first silicon section and a second raised source/drain region in the second silicon section.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
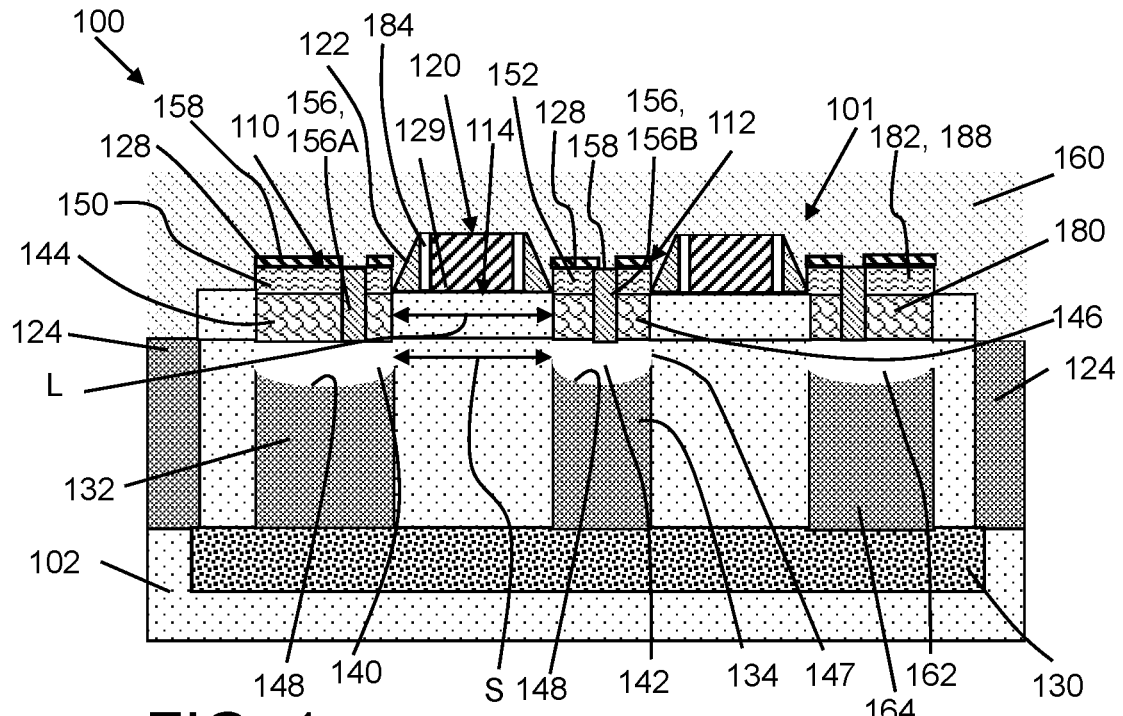
FIG. 1 shows a cross-sectional view of a transistor, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a transistor that includes a bulk semiconductor substrate, and a first raised source/drain region above the bulk semiconductor substrate separated from a second raised source/drain region above the bulk semiconductor. A gate is between the first and second raised source/drain regions. A first dielectric section is beneath the first raised source/drain region in the bulk semiconductor substrate, and a second dielectric section is beneath the second raised source/drain region in the bulk semiconductor substrate. A first air gap is defined in at least the first dielectric section under the first raised source/drain region, and a second air gap is defined in at least the second dielectric section under the second raised source/drain region. The air gaps reduce off capacitance of the bulk semiconductor structure to near semiconductor-on-insulator levels without the disadvantages of an air gap under the channel region.

FIG. 1 shows a cross-sectional view of a pair of adjacent transistors 100, 101, according to embodiments of the disclosure. These transistors 100, 101 could form a single multi-finger transistor or two separate transistors. For purposes of description, only one transistor 100 (left side) will be described herein, the other transistor 101 (right side) is generally a mirror image of the one transistor and they may share a middle raised source/drain region. Transistor 100 includes a semiconductor substrate 102 that, in an illustrative embodiment, is a bulk semiconductor substrate and not a semiconductor on insulator (SOI) substrate. Bulk semiconductor substrate 102 may include any now known or later developed semiconductor material such as but not limited to silicon, germanium, silicon germanium, and silicon carbide. A portion or entire semiconductor substrate 102 may be strained.

Transistor 100 also includes a pair of raised source/drain (RSD) regions 110, 112 above bulk semiconductor substrate 102. That is, transistor 100 includes a first raised source/drain (RSD) region 110 above bulk semiconductor substrate 102 separated from a second raised source/drain (RSD) region 112 above bulk semiconductor substrate 102, e.g., by a channel region 114. RSD regions 110, 112 may include any appropriate dopants.

A gate 120 is between pair of RSD regions 110, 112. That is, gate 120 is between first RSD region 110 and second RSD region 112. Gate 120 is also over channel region 114. Gate 120 may include any now known or later developed gate material. In one non-limiting example, gate 120 may include polysilicon. In another example, gate 120 may include a metal gate. Although shown as a single material for clarity, metal gates may include one or more conductive components for providing a gate terminal of a transistor. For example, metal gates may include a high dielectric constant (high-K) layer, a work function metal layer and a gate conductor (not all shown for clarity). The high-K layer may include any now known or later developed high-K material typically used for metal gates such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). The work function metal layer may include various metals depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. The gate conductor may include any now known or later developed gate conductor such as copper (Cu). A gate cap (not shown) of, for example, a nitride may also be formed over the gate region. Gate 120 may also include at least one spacer 122, 184 thereabout, e.g., of silicon nitride. It is noted that RSD regions 110, 112 are considered 'raised' because an upper surface 128 of first and second RSD regions 110, 112 are higher than a lower surface 129 of gate 120.

Transistor 100 may also include any form of a trench isolation 124 in bulk semiconductor substrate 102 and surrounding first RSD region 110 and second RSD region 112. As understood in the art, trench isolation 124 may isolate one region of substrate 102 from an adjacent region of substrate 102. One or more transistors of a given polarity may be disposed within an area isolated by trench isolation 124. Each trench isolation 124 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, or layers thereof.

Figure 2:
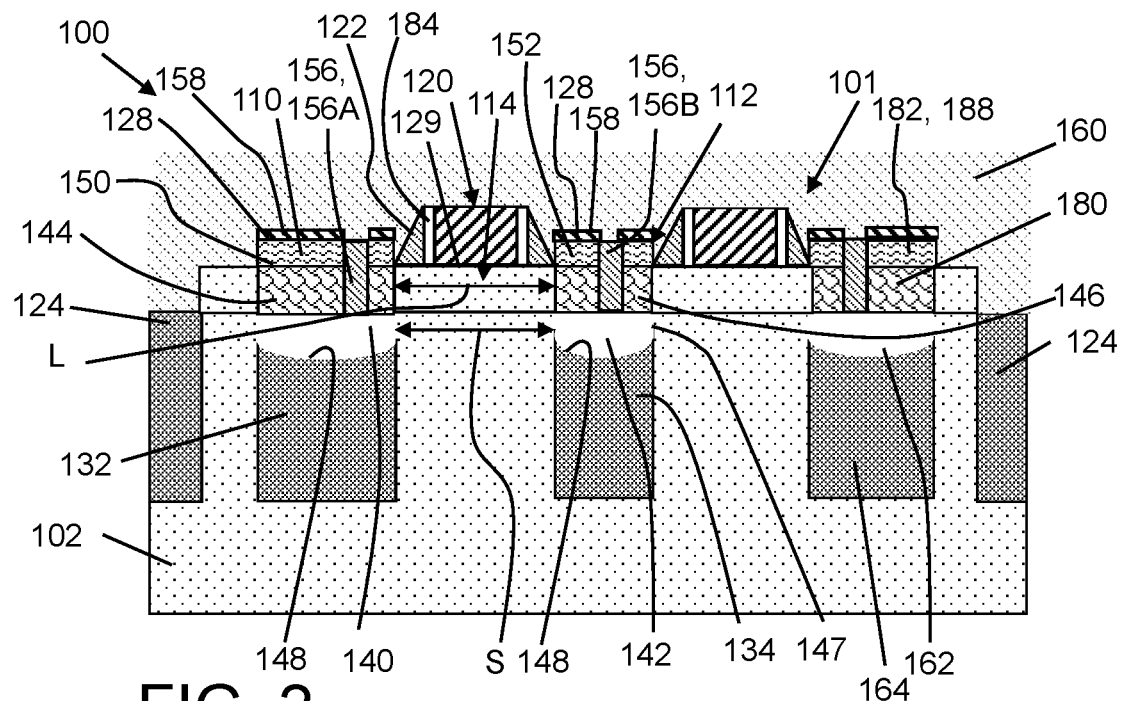
FIG. 2 shows a cross-sectional view of a transistor, according to embodiments of the disclosure.

In one embodiment, transistor 100 may also include a doped polysilicon isolation region 130 in bulk semiconductor 102 and below trench isolation 124. In one example, polysilicon isolation region 130 extends below gate 120, first RSD region 110, and second RSD region 112. Isolation region 130 may alternatively extend between sides of trench isolation 124. Doped polysilicon isolation region 130 may include any dopant capable of forming an insulative polysilicon, e.g., argon, in substrate 102. As understood in the art, doped polysilicon isolation region 130 provides high resistivity electrical isolation for transistor 100. FIG. 2 shows a cross-sectional view of another embodiment in which doped polysilicon isolation region 130 is omitted.

Transistor 100 also includes a dielectric section 132, 134 in bulk semiconductor substrate 102 under each of pair of RSD regions 110, 112. More specifically, transistor 100 includes a first dielectric section 132 beneath first RSD region 110 in bulk semiconductor substrate 102, and a second dielectric section 134 beneath second RSD region 112 in bulk semiconductor substrate 102. Dielectric sections 132, 134 may include any dielectric material listed for trench isolation 124. In certain embodiments, dielectric sections 132, 134 include the same material as trench isolation 124, so as will be described, they can be built at the same time.

Transistor 100 includes an air gap 140, 142 defined in at least each dielectric section 132, 134 under pair of RSD regions 110, 112. More specifically, transistor 100 includes a first air gap 140 defined in at least first dielectric section 132 and under first RSD region 110, and a second air gap 142 defined in at least second dielectric section 134 and under second RSD region 112. Air gaps 140, 142 are cavities or voids in at least dielectric sections 132, 134. Air gaps 140, 142 thus act as gas dielectrics. Air gaps 140, 142 may also be partially defined by bulk semiconductor material 102 adjacent dielectric sections 132, 134, e.g., depending on the duration of the etching used to create them. As illustrated, bulk semiconductor substrate 102 may define an inner sidewall surface 147 (shown for right air gap 142 only for clarity) of each air gap 140, 142, and dielectric sections 132, 134 may define a lower surface 148 of each air gap 140, 142. A spacing S between first air gap 140 and second air gap 142 is greater than or equal to a length L of channel region 114 such that first and second air gaps 140, 142 are not under channel region 114. In FIGS. 1 and 2, sides of first air gap 140 and second air gap 142 are aligned to edges of gate 120 (i.e., spacer 122 thereof) and channel 114 such that spacing S is equal to length L of channel region 114.

As shown in FIGS. 1-2, transistor 100 may also include a polysilicon section 144, 146 between each of pair of RSD regions 110, 112 and a respective air gap 140, 142. More specifically, transistor 100 may include a first polysilicon section 144 between first RSD region 110 and first air gap 140, and a second polysilicon section 146 between second RSD region 112 and second air gap 142. Polysilicon sections 144, 146 are artifacts of a method of fabrication, described herein. Polysilicon sections 144, 146 are generally aligned over respective dielectric sections 132, 134. As shown in the drawings, each air gap 140, 142 is in direct contact with a respective one of polysilicon sections 144, 146. More particularly, first air gap 140 is in direct contact with first polysilicon section 144, and second air gap 142 is in direct contact with second polysilicon section 146. Polysilicon section 144 is in direct contact with first RSD region 110, and second polysilicon section 146 is in direct contact with second RSD region 112. Air gaps 140, 142 may be formed without a liner therein (not shown for clarity) such that a lower, inner surface 148 of each of first air gap 140 and second air gap 142 is the same material as bulk semiconductor substrate 102.

RSD regions 110, 112 are formed in silicon sections 150, 152 over polysilicon sections 144, 146, respectively. Silicon sections 150, 152 may have a thickness similar to that of a semiconductor-on-insulator (SOI) layer of an SOI substrate and may provide similar performance as an SOI substrate using air gaps 140, 142 and optionally doped polysilicon isolation region 130, rather than a buried insulator layer.

For reasons that will be made apparent herein, transistor 100 may also include a filled vent hole 156 extending through each of first RSD region 110 and second RSD region 112, and respective polysilicon sections 144, 146 thereunder. That is, a first filled vent hole 156A may extend through first RSD region 110 and first polysilicon section 144, and a second filled vent hole 156B may extend through second RSD region 112 and second polysilicon section 146. Filled vent holes 156 may be filled with, for example, a nitride.

Transistor 100 may also include a metallic layer 158 over each of pair of RSD regions 110, 112 and surrounding each respective filled vent hole 156 therein. That is, metallic layer 158 is over first and second RSD regions 110, 112 and surrounding each respective filled vent hole 156A, 156B therein. Metallic layer 158 may include a silicide for coupling to contacts (not shown for clarity) through an interlayer dielectric (ILD) 160. ILD 160 may be deposited and include any now known or later developed ILD material. For example, ILD 160 may include but is not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric.

"Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. ILD 160 may be deposited using, for example, ALD.

It will be recognized that transistor 101 may include similar structure as transistor 100. In other embodiments, transistor 101 may be omitted. As illustrated, where transistors 100, 101 are a pair, a third air gap 162 defined in at least a third dielectric section 164 and under another RSD region 188 (in silicon section 182) may be provided.

FIGS. 3-8 show embodiments of a method of forming transistor 100, 101, according to embodiments of the disclosure.

Figure 3:
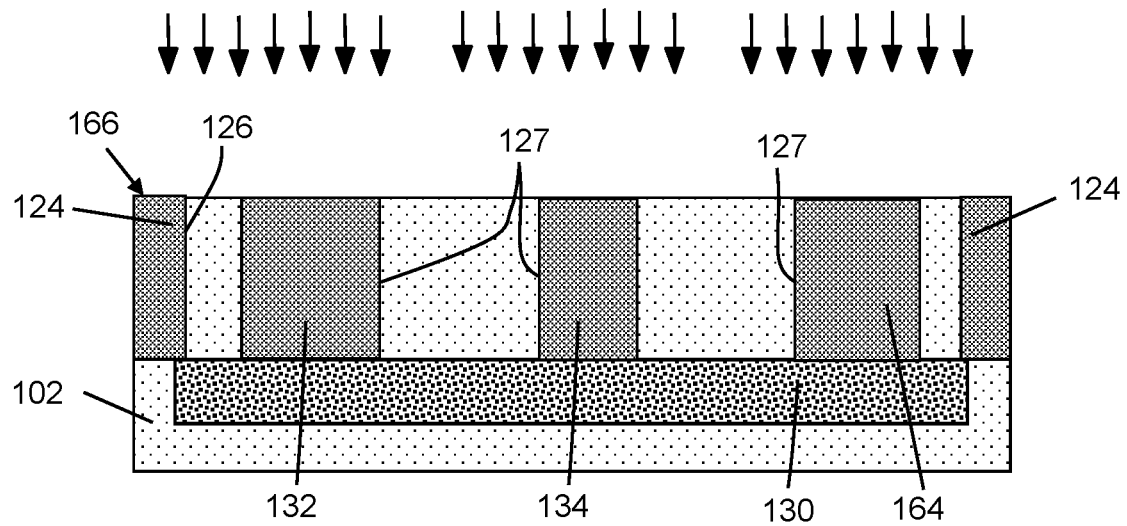
FIG. 3 shows a cross-sectional view of a preliminary structure for a method including dielectric sections in a bulk semiconductor substrate, according to embodiments of the disclosure.

FIG. 3 shows a cross-sectional view of one embodiment of a preliminary structure 166 according to embodiments of the disclosure. Preliminary structure 166 may include bulk semiconductor substrate 102, as described herein. FIG. 3 shows forming trench isolation 124 in bulk semiconductor substrate 102, and first dielectric section 132 spaced from second dielectric section 134 in bulk semiconductor substrate 102. As illustrated, first and second dielectric sections 132, 134 are each spaced from trench isolation 124. With regard to trench isolation 124, a trench 126 may be etched into substrate 102, e.g., using a mask (not shown), and filled with an insulating material such as oxide, to isolate one region of the substrate from an adjacent region of the substrate. Trench isolation 124 surrounds the area in which transistor(s) 100 will be built. With regard to dielectric sections 132, 134, trenches 127 may be etched into substrate 102, e.g., using a mask (not shown), and filled with an insulating material such as oxide, to form dielectric sections 132, 134. Dielectric sections 132, 134 may have some length and width, but are standalone structures within substrate 102. Dielectric sections 132, 134 are laterally positioned and have a width to match, as close as possible, that of RSD regions 110, 112 to be formed thereover. The two trench formation steps can happen simultaneously. Any of trench isolation 124 materials listed herein may be used for trench isolation 124 and dielectric sections 132, 134. Hence, trench isolation 124 and dielectric sections 132, 134 may include the same material, e.g., silicon oxide. Dielectric sections 132, 134 may also be referred to as trench isolations. Any necessary planarization can be carried out to remove excess insulating material.

Etching generally refers to the removal of material from a substrate (or structures formed on the substrate) and is often performed with a mask (not shown) in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases, which approach the wafer approximately from one direction, and therefore this process is highly anisotropic. Reactive-ion etching (ME) operates under conditions intermediate between sputter and plasma etching and may be used to produce deep, narrow features, such as trenches 126 for trench isolation 124, and trenches 127 for dielectric sections 132, 134.

FIG. 3 also shows an optional doping to form a doped polysilicon isolation region 130 in bulk semiconductor substrate 102 below trench isolation 124. Doped polysilicon isolation region 130 may be formed in any now known or later developed fashion, such as but not limited to doping, e.g., via ion implanting (arrows) and annealing, argon with sufficient dosage and strength to form the isolation region at a desired depth in substrate 102. See U.S. Pat. No. 10,192, 779. Any form of nitride cap (not shown) may be used to control the positioning and shape of isolation region 130. As shown in one non-limiting example in FIGS. 1 and 3, the doping forms doped polysilicon isolation region 130 in bulk semiconductor substrate 102 extending under later-formed first RSD region 110, second RSD region 112, gate 120, first air gap 140 and second air gap 142. Other arrangements of isolation region 130 are also possible.

Figure 4:
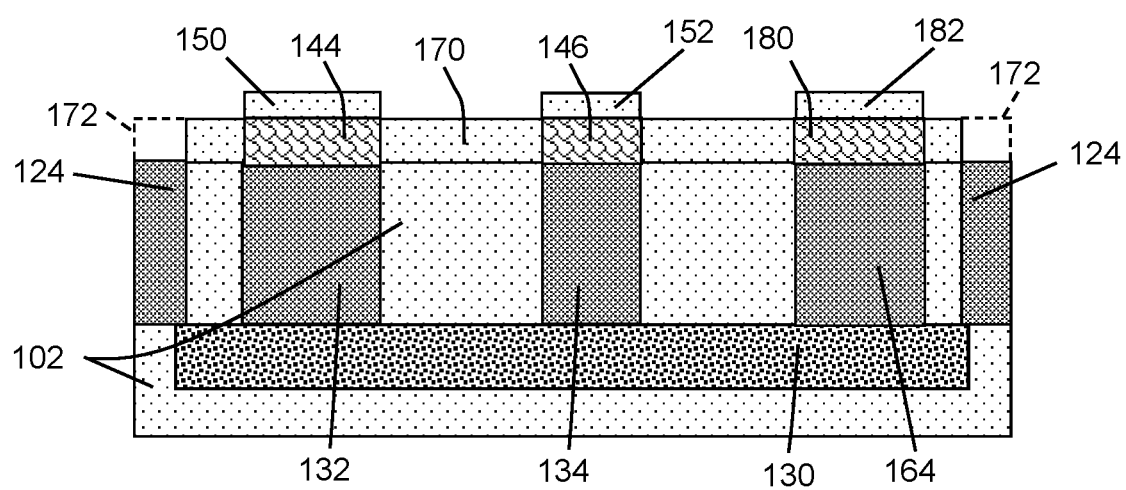
FIG. 4 shows a cross-sectional view of forming polysilicon sections, silicon sections and a silicon layer, according to embodiments of the disclosure.

FIG. 4 shows a cross-sectional view of forming a first polysilicon section 144 on first dielectric section 132, a second polysilicon section 146 on second dielectric section 134, and a silicon layer 170 over bulk semiconductor substrate 102 between first polysilicon section 144 and second polysilicon section 146. A third polysilicon section 180 is also shown over third dielectric section 164. This process may include epitaxially growing first polysilicon section 144 over first dielectric section 132, second polysilicon section 146 over second dielectric section 134, and silicon layer 170 over bulk semiconductor substrate 102. The terms "epitaxial growth" and "epitaxially formed and/or grown" mean the growth of a semiconductor material such as silicon on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Hence, where the growth occurs on dielectric sections 132, 134 and trench isolations 124, polysilicon is formed, and where growth occurs on substrate 102, silicon is formed. Polysilicon sections 172 (dashed lines) that would form on trench isolations 124 are removed, e.g., by forming any necessary mask and etching to remove the polysilicon from over trench isolations 124. Polysilicon sections 144, 146 (and 180) have a width to match, as close as possible, that of RSD regions 110, 112 to be formed thereover. In one non-limiting example, for a 14 nm technology node, the width may be 360-400 nanometers, or the width may be 560-600 nanometers, or any width in between those ranges. Polysilicon sections 144, 146 (and 180) may have a thickness of, for example, 10-30 nm.

FIG. 4 also shows forming a first silicon section 150 over first polysilicon section 144 and a second silicon section 152 over second polysilicon section 146 (and third silicon section 182 over third polysilicon section 180, where provided). Silicon sections 150, 152 may be formed as a continuance of the epitaxial growth from bulk semiconductor substrate 102 and polysilicon sections 144, 146, 180. Silicon sections 150, 152, 182 may have any thickness desired for RSD regions 110, 112. In one embodiment, a thickness of silicon sections 150, 152, 182 over polysilicon sections 144, 146, 180 is made to approach that of SOI layers in SOI substrates to obtain similar performance as SOI substrates even though transistor 100 is formed on bulk semiconductor substrate 102. In one non-limiting example, silicon sections 150, 152, 182 may have a thickness in the range of 30 to 50 nanometers.

Figure 5:
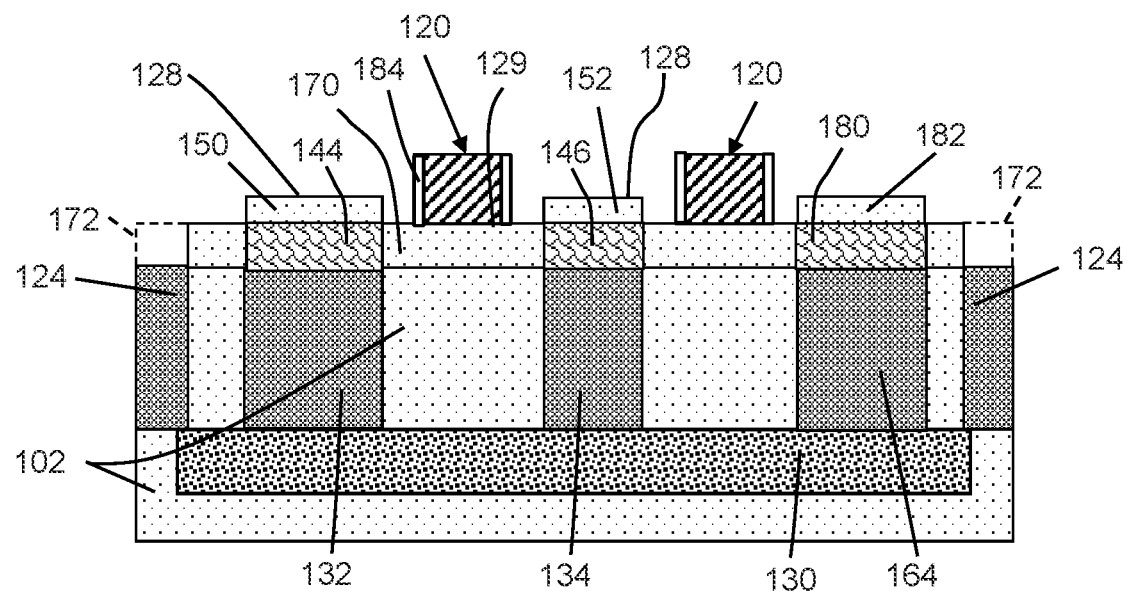
FIG. 5 shows a cross-sectional view of forming a gate, according to embodiments of the disclosure.

FIG. 5 shows a cross-sectional view of forming a gate 120 over a region of silicon layer 170 between first silicon section 150 and second silicon section 152. As illustrated, an upper surface 128 of first and second silicon sections 150, 152 are higher than a lower surface 129 of gate 120. Silicon layer 170 provides channel region 114 (FIGS. 1-2) between eventually formed first RSD region 110 and second RSD region 112. Gate(s) 120 may be formed using any now known or later developed processes. In one non-limiting example, gate(s) 120 material may be deposited and patterned using photolithography, and a first spacer 184 formed thereabout, e.g., by depositing a nitride and etching back. A nitride cap (not shown) may be formed over gate(s) 120. Gate(s) 120 may include dummy gate material, e.g., including sacrificial material to be replaced with the final gate material after the raised source/drain regions' formation (FIG. 8), or they may include the final gate material, e.g., polysilicon or metal gate material. In any event, as described, first polysilicon section 144 and first silicon section 150 and second polysilicon section 146 and second silicon section 152 occur prior to forming gate 120.

Figure 6:
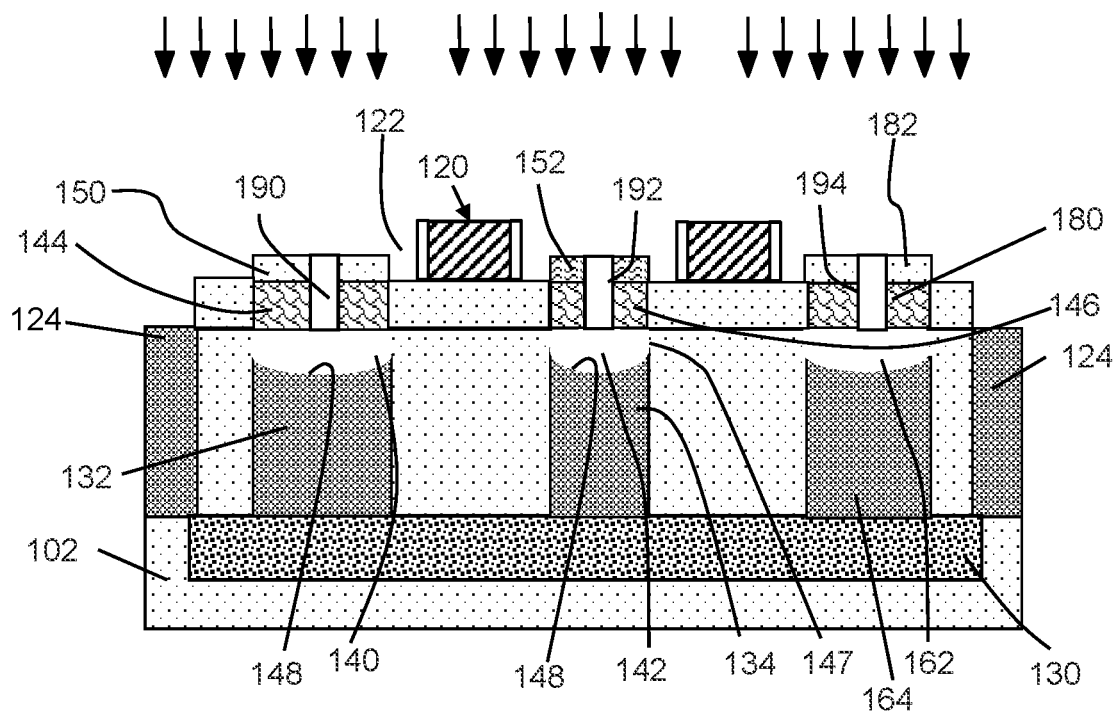
FIG. 6 shows a cross-sectional view of forming vent holes and removing portions of dielectric sections, according to embodiments of the disclosure.
Figure 7:
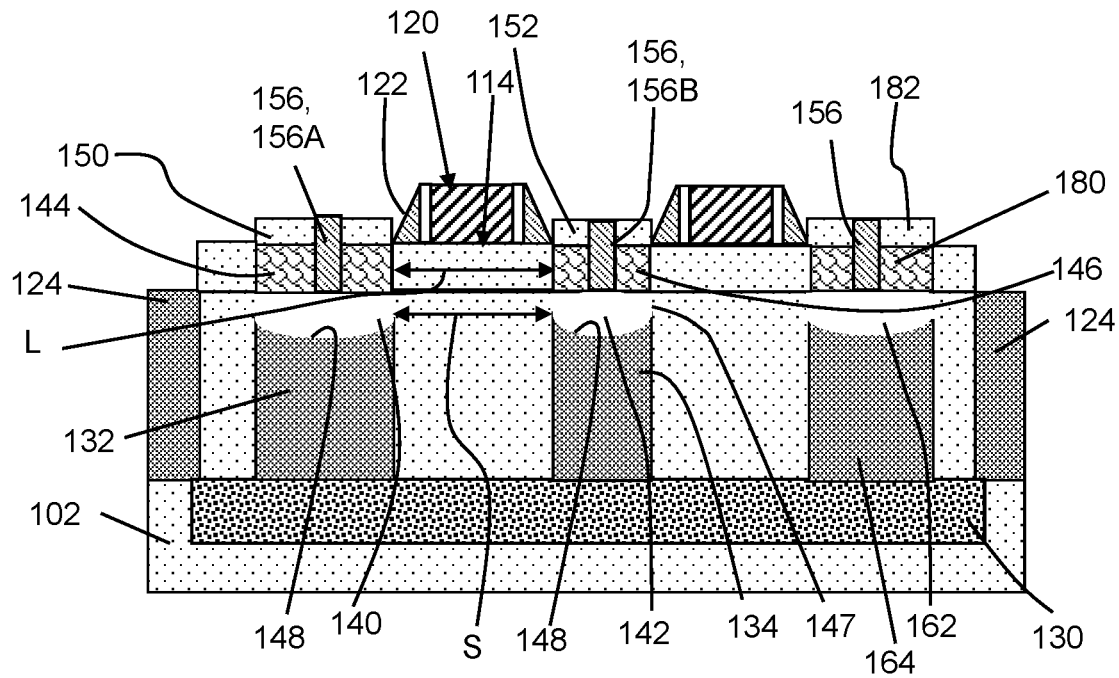
FIG. 7 shows a cross-sectional view of forming air gaps by filling the vent holes, according to embodiments of the disclosure.

FIGS. 6 and 7 show cross-sectional views of forming first air gap 140 in first dielectric section 132 under first polysilicon section 144 and second air gap 142 in second dielectric section 134 under second polysilicon section 146. A third air gap 162 may also be optionally formed under polysilicon section 180. Air gaps 140, 142 forming under first and second polysilicon sections 144, 146 may include forming a first vent hole 190 through first silicon section 150 and first polysilicon section 144, and a second vent hole 192 through second silicon section 152 and second polysilicon section 146. A third vent hole 194 may also be formed at the same time through third silicon section 182 and third polysilicon section 180 (where provided). Vent holes 190, 192, 194 may be formed using any now known or later developed process, e.g., forming a patterned mask having small openings matching the location of vent holes 190, and etching (e.g., a RIE). FIG. 6 also shows removing a first portion of first dielectric section 132 under first polysilicon section 144 through first vent hole 190 and a second portion of second dielectric section 134 under second polysilicon section 146 through second vent hole 192. Similar processing may occur for third dielectric section 164 (where provided). The removing may include etching portions of dielectric sections 132, 134 (and 164) using, for example, hot ammonia ($NH_3$) and/or hydrochloric acid, through vent holes 190, 192 (and 194), as known in the art. Bulk semiconductor substrate 102 may define inner sidewall surface 147 (shown for right air gap 142 only for clarity) of each of air gap 140, 142, 162, and dielectric sections 132, 134 may define lower surface 148 of each air gap 140, 142. A spacing S between first air gap 140 and second air gap 142 is greater than or equal to a length L of channel region 114 such that first and second air gaps 140, 142 are not under channel region 114. Consequently, as shown in FIGS. 1 and 2, sides of first air gap 140 and second air gap 142 are aligned to edges of gate 120 (i.e., spacer 122 thereof) and channel 114 such that spacing S is equal to length L of channel region 114. After the portions of dielectric sections 132, 134 (and 164) are removed, an optional thermal oxidation to passivate the air gap semiconductor surfaces may be performed. The removal of the portions of dielectric sections 132, 134 (and 164) leaves gas in the spaces, e.g., air.

FIG. 7 shows a cross-sectional view of sealing first and second vent holes 190, 192 (and 194) (FIG. 6) to form/complete first air gap 140 and second air gap 142 (and third air gap 162, where desired). This process also forms filled vent holes 156. Sealing may be carried out, for example, by depositing a dielectric such as nitride and/or a spacer nitride, which also forms spacer 122 on gate 120. That is, sealing first and second vent holes 190, 192 may further include forming a spacer 122 adjacent gate 120, i.e., first spacer 184. It is noted that vent holes 190, 192, 194 (FIG. 6) have a sufficiently small lateral size (across or into page in FIGS. 6-7) compared to eventually formed RSD regions 110, 112 (FIGS. 1-2), so that sealing them does not adversely impact the electrical properties of RSD regions 110, 112 (FIGS. 1-2).

Figure 8:
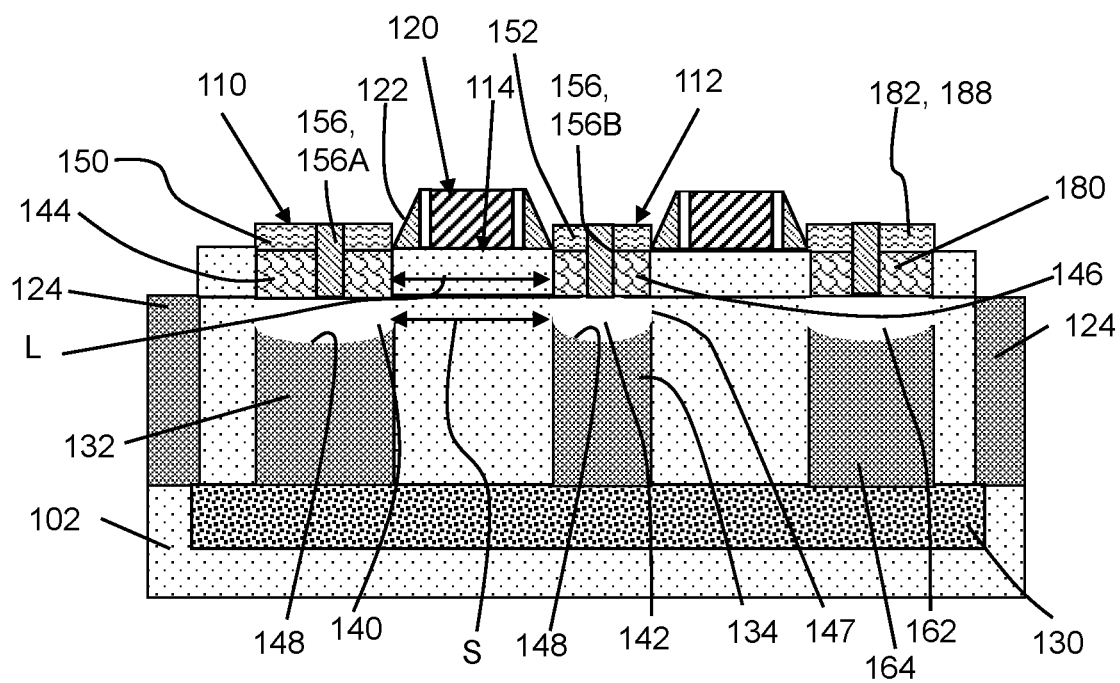
FIG. 8 shows a cross-sectional view of forming raised source/drain regions, according to embodiments of the disclosure.

FIG. 8 shows a cross-sectional view of forming first RSD region 110 in first silicon section 150 and second RSD region 112 in second silicon section 152. RSD regions 110, 112 (and third RSD region 188) may be formed using any now known or later developed processes. For example, RSD regions 110, 112 (and 188) may be formed by doping silicon sections 150, 152, 182 with appropriate dopants (e.g., using ion implanting), and annealing to drive in the dopants. The dopants used may vary depending on the type of transistor to be formed FIGS. 1-2 show processing after forming metallic layer 158 over each of pair of RSD regions 110, 112 (and 188) and surrounding each respective filled vent hole 156 therein. That is, metallic layer 158 is over first and second RSD regions 110, 112 and surrounding each respective filled vent hole 156A, 156B therein. Metallic layer 158 may include any silicide for coupling to contacts (not shown) through an interlayer dielectric (ILD) 160. Metallic layer 158 may be formed using any now known or later developed technique, e.g., performing an in-situ pre-clean, depositing a metal such as titanium, nickel, cobalt, platinum, etc., annealing to have the metal react with silicon of silicon sections 150, 152, and removing unreacted metal. The metal does not react with filled vent holes 156, hence they are not covered by metallic layer 158. As noted, ILD 160 may be deposited and include any now known or later developed ILD material as listed herein. Any desired interconnects, e.g., contacts and wiring (not shown), may be formed through ILD 160 in a known fashion.

Embodiments of the disclosure provide transistor 100 exhibiting reduced junction capacitance because of the presence of air gaps 140, 142 even though the transistor is built in a bulk semiconductor substrate 102. While SOI substrates typically have approximately 50% lower drain-source capacitance ($C_{DS}$) compared to bulk semiconductor substrates due to the buried insulator layer, air gaps 140, 142 under RSD regions 110, 112 reduce the $C_{DS}$ in bulk semiconductor substrate 102. The reduction in $C_{Ds}$ by air gaps 140, 142 under RSD regions 110, 112 may be up to approximately 50%, which can reduce off capacitance ($C_{off}$) by up to 25% to approach or match that value in SOI substrates. While air gaps 140, 142 provide this advantage, they are not located under channel region 114, thus eliminating any mechanical stresses caused by that arrangement. Transistor 100 also exhibits a shallower channel with additional silicon thickness reduction.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A transistor, comprising:
a bulk semiconductor substrate;
a first raised source/drain region above the bulk semiconductor substrate separated from a second raised source/drain region above the bulk semiconductor substrate;
a gate between the first raised source/drain region and the second raised source/drain region;
a first dielectric section beneath the first raised source/drain region in the bulk semiconductor substrate;
a second dielectric section beneath the second raised source/drain region in the bulk semiconductor substrate;
a first air gap defined in at least the first dielectric section and under the first raised source/drain region;
a second air gap defined in at least the second dielectric section and under the second raised source/drain region; and
a first filled vent hole extending through the first raised source/drain region and a second filled vent hole extending through the second raised source/drain region.

2. The transistor of claim 1, further comprising:
a trench isolation in the bulk semiconductor substrate and surrounding the first and second raised source/drain regions; and
a doped polysilicon isolation region in the bulk semiconductor substrate and below the trench isolation.

3. The transistor of claim 2, wherein the first and second dielectric sections include a same material as the trench isolation.

4. The transistor of claim 1, further comprising a first polysilicon section between the first raised source/drain region and the first air gap, and a second polysilicon section between the second raised source/drain region and the second air gap.

5. The transistor of claim 4, wherein the first air gap is in direct contact with the first polysilicon section, and the second air gap is in direct contact with the second polysilicon section.

6. The transistor of claim 4, wherein the first filled vent hole extends through the first raised source/drain region and the first polysilicon section, and the second filled vent hole extends through the second raised source/drain region and the second polysilicon section.

7. The transistor of claim 6, further comprising a metallic layer over the first and second raised source/drain regions and surrounding each respective filled vent hole therein.

8. The transistor of claim 1, further comprising:
a trench isolation in the bulk semiconductor substrate and surrounding the first and second raised source/drain regions; and
wherein the first and second dielectric sections include a same material as the trench isolation.

9. The transistor of claim 1, wherein the bulk semiconductor substrate defines an inner sidewall surface of each of the first air gap and the second air gap, the first dielectric section defines a lower surface of the first air gap, and the second dielectric section defines a lower surface of the second air gap.

10. A transistor, comprising:
a bulk semiconductor substrate;
a pair of raised source/drain regions above the bulk semiconductor substrate;
a gate between the pair of raised source/drain regions;
a dielectric section in the bulk semiconductor substrate under each of the pair of raised source/drain regions;
an air gap defined in at least each dielectric section under the pair of raised source/drain regions;
a pair of polysilicon sections, each polysilicon section in the pair of polysilicon sections between a respective raised source/drain region and a respective air gap;
a pair of filled vent holes, each filled vent hole in the pair of filled vent holes extending through a respective raised source/drain region and through the respective polysilicon section thereunder;
a trench isolation in the bulk semiconductor substrate and surrounding the pair of raised source/drain regions; and
a doped polysilicon isolation region in the bulk semiconductor substrate and below the trench isolation,
wherein the dielectric sections include a same material as the trench isolation.

11. The transistor of claim 10, wherein each air gap is in direct contact with a respective one of the polysilicon sections.

12. The transistor of claim 10, further comprising: a metallic layer over each of the pair of raised source/drain regions and surrounding each respective filled vent hole therein,
wherein each filled vent hole extends through each respective source/drain region of the pair of raised source/drain regions and through each respective polysilicon section thereunder.

13. The transistor of claim 10, wherein the bulk semiconductor substrate defines an inner sidewall surface of each of the air gaps, and the dielectric sections define a lower surface of each air gap.

14. A method, comprising:
forming a trench isolation in a bulk semiconductor substrate, and a first dielectric section spaced from a second dielectric section in the bulk semiconductor substrate, the first and second dielectric sections each spaced from the trench isolation;
forming a first polysilicon section on the first dielectric section, a second polysilicon section on the second dielectric section, and a silicon layer over the bulk semiconductor substrate between the first polysilicon section and the second polysilicon section;
forming a first silicon section over the first polysilicon section and a second silicon section over the second polysilicon section;
forming a gate over a region of the silicon layer between the first silicon section and the second silicon section, wherein an upper surface of the first and second silicon sections are higher than a lower surface of the gate; and
forming a first air gap in the first dielectric section under the first polysilicon section and a second air gap in the second dielectric section under the second polysilicon section; and
forming a first raised source/drain region in the first silicon section and a second raised source/drain region in the second silicon section,
forming a first filled vent hole extending through the first raised source/drain region; and
forming a second filled vent hole extending through the second raised source/drain region.

15. The method of claim 14, further comprising doping to form a doped polysilicon isolation region in the bulk semiconductor substrate below the trench isolation.

16. The method of claim 14, wherein forming the first air gap and the second air gap includes:
forming a first vent hole through the first silicon section and the first polysilicon section and a second vent hole through the second silicon section and the second polysilicon section;
removing a first portion of the first dielectric section under the first polysilicon section through the first vent hole and a second portion of the second dielectric section under the second polysilicon section through the second vent hole; and
sealing the first and second vent holes to form the first air gap and the second air gap.

17. The method of claim 16, wherein sealing the first and second vent holes further includes forming a spacer adjacent the gate.

18. The method of claim 16, further comprising forming a metallic layer over each of the pair of raised source/drain regions and surrounding each respective filled vent hole therein.

19. The method of claim 14, wherein forming the first and second polysilicon sections and the silicon layer includes epitaxially growing the first polysilicon section over the first dielectric section, the second polysilicon section over the second dielectric section, and the silicon layer over the bulk semiconductor substrate.

20. The method of claim 14, wherein forming the first polysilicon section and the first silicon section and the second polysilicon section and the second silicon section occur prior to forming the gate.

* * * * *